(12) United States Patent
Oike et al.

(10) Patent No.: US 6,788,468 B2
(45) Date of Patent: Sep. 7, 2004

(54) WAVELENGTH LOCKER MODULE AND WAVELENGTH CONTROLLER FOR OPTICAL COMMUNICATION

(75) Inventors: Mizuki Oike, Tokyo (JP); Hiroshi Matsuura, Tokyo (JP); Satoru Abe, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/986,876

(22) Filed: Nov. 13, 2001

(65) Prior Publication Data

US 2003/0090808 A1 May 15, 2003

(51) Int. Cl.⁷ .............................................. G02B 27/14

(52) U.S. Cl. ........................ 359/634; 359/637; 359/640

(58) Field of Search ................................ 359/637, 640, 359/618, 568, 889, 418, 634, 639; 348/335, 339; 349/9; 353/34

(56) References Cited

U.S. PATENT DOCUMENTS

| | | | |
|---|---|---|---|
| 5,646,399 A | * | 7/1997 | Fukushima et al. .......... 250/226 |
| 6,215,597 B1 | * | 4/2001 | Duncan et al. .............. 359/637 |
| 6,456,767 B2 | * | 9/2002 | Terashima ..................... 385/49 |
| 2002/0041611 A1 | * | 4/2002 | May ......................... 372/29.02 |
| 2002/0051270 A1 | * | 5/2002 | Tatsuno et al. .............. 359/187 |
| 2002/0154858 A1 | * | 10/2002 | Kojima .......................... 385/24 |
| 2002/0172243 A1 | * | 11/2002 | Ono et al. ................ 372/29.02 |
| 2002/0177243 A1 | * | 11/2002 | Ono et al. ................ 372/29.02 |

* cited by examiner

Primary Examiner—Ricky Mack
Assistant Examiner—Brandi Thomas
(74) Attorney, Agent, or Firm—Oblon, Spivak, McClelland, Maier & Neustadt, P.C.

(57) ABSTRACT

A wavelength controller includes a wavelength locker module, having a prism for dividing incident light into first and second branched light beams, a first light quantity detector for receiving the first branched light beam through a wavelength selective filter and a second light quantity detector for directly receiving the second branched light beam, and detects and suppresses a wavelength variation in incident light entering the module based on outputs of the light quantity detectors.

11 Claims, 7 Drawing Sheets

US 6,788,468 B2

WAVELENGTH LOCKER MODULE AND WAVELENGTH CONTROLLER FOR OPTICAL COMMUNICATION

BACKGROUND OF THE INVENTION

1. Technical Field

The present invention relates to a wavelength locker module for detecting quantities of light beams branched from an optical signal for optical communication, the quantities being utilized for detection of a wavelength variation in the optical signal, and relates to a wavelength controller, including a wavelength locker module, for detecting and suppressing a wavelength variation in an optical signal.

2. Related Art

For optical communication, a wavelength division multiplexing (WDM) system, for instance, is utilized which simultaneously transmits multiplexed laser beams of different wavelengths having information superposed thereon. To realize a stable large-capacitance optical transmission, the channel spacing, i.e., wavelength interval between adjacent laser beams, is narrow and the wavelength of each laser beam is stabilized. The demand for wavelength stabilization intensifies in a dense wavelength division multiplexing (DWDM) system where the channel spacing is made smaller for larger transmission capacity.

A light source for the WDM system is comprised of, e.g., a distributed feed-back (DFB) semiconductive laser which is excellent in single-mode oscillation but generates output light whose wavelength tends to vary with a temperature change and secular change in the DFB semiconductive laser. For wavelength stabilization of the output light of the DFB semiconductive laser, therefore, a wavelength controller with a so-called wavelength locker module is employed.

A typical wavelength controller is designed to detect a wavelength variation (wavelength shift) in incident light from a semiconductive laser, and make the wavelength of laser light constant by changing the temperature of the semiconductive laser so as to compensate for the wavelength variation based on a temperature-wavelength characteristic of the semiconductive laser. Since an intensity level variation in the incident light caused by a secular change of the semiconductive laser produces an error in wavelength variation detection, the wavelength controller uses the wavelength locker module for branching the incident light into two or more branched light beams and for detecting light beam quantities, whereby the intensity level variation and the wavelength variation in the incident light are detected independently of each other based on the detected light beam quantities.

In some wavelength locker modules, an optical branching coupler is used to branch incident light. This makes it difficult to attain a compact wavelength locker module because of the presence of a large-sized branching coupler. Thus, another type of wavelength locker module has been employed, which is provided with a filter for branching or demultiplexing incident light instead of a branching coupler.

FIG. 10 shows by way of example a conventional wavelength locker module with a branching filter. In this wavelength locker module 8, the output light of a semiconductive laser enters a branching filter 13 through an incident section 1 and a lens 2. The branching filter 13 is comprised of a bandpass filter, an etalon or the like, and serves to reflect light, falling within a prescribed wavelength region, at a constant reflection coefficient. The incident light entering the branching filter 13 is reflected by the branching filter 13 at the constant reflection coefficient, if the wavelength falls within the prescribed wavelength region. Part of the incident beam is reflected by the branching filter 13 and enters a second photodiode 5, which is provided at its incident side with a condensing lens 10. The remaining incident transmits through the branching filter 13 and enters, via a wavelength selective transmission filter 6, a first photodiode 4 which has an incident side provided with a condensing lens 9.

The wavelength selective transmission filter 6 has the transmittance-wavelength characteristic exemplarily shown by the characteristic curve b in FIG. 9 in which the transmittance of the transmission filter 6 is plotted in the right ordinate axis and the output of the first photodiode 4 is plotted in the left ordinate axis, with the wavelength of incident light entering the filter 6 plotted in the abscissa axis. As apparent from FIG. 9, the transmittance of the filter 6 and the output of the first photodiode 4 vary in dependence on incident light wavelength. Specifically, when the incident light wavelength shifts toward the long-wavelength side from the rated wavelength A to the wavelength B, the output of the first photodiode 4 changes to decrease by $\Delta b$ from the value a, whereas the photodiode output changes to increase by $\Delta c$ from the value a when the wavelength shifts toward the short-wavelength side from the rated wavelength A to the wavelength C.

As mentioned above, there occurs a change in the output of the first photodiode 4 with a wavelength variation in the semiconductive laser light. In addition, an intensity variation in the laser light caused by a secular change in the semiconductive laser can cause a variation in the output of the first photodiode 4. In the wavelength locker module 8 shown in FIG. 10, the intensity of the incident light entering the wavelength locker module 8, which intensity corresponds to the laser output intensity, is detected by a second photodiode 5. Then, it is determined that a wavelength variation occurs in the laser light, if the output of the second photodiode 5 has the ordinary value and if the output of the first photodiode 4 shifts from the ordinary value.

FIG. 11 shows a conventional wavelength locker module having a demultiplexing filter used to demultiplex incident light for the detection of wavelength variation. The demultiplexing filter 19 is comprised of a bandpass filter, an etalon or the like and reflects incident light, falling within the prescribed wavelength region, at the reflection coefficient that varies depending on the wavelength of the incident light. In the wavelength locker module 8, the output light of a semiconductive laser enters the demultiplexing filter 19 through an incident section 1 and a lens 2, and part of the incident light passes through the demultiplexing filter 19 to enter a first photodiode 4, whereas the remaining incident light is reflected by the demultiplexing filter 19, to be entered into a second photodiode 5. The output characteristics of the first and second photodiodes 4, 5 are shown by the characteristic lines g and h in FIG. 13. As shown in FIG. 13, the outputs of the photodiodes 4, 5 vary depending on the wavelength of the incident light entering the demultiplexing filter 19, i.e., the wavelength of the output light of the semiconductive laser. Thus, it is possible to detect, based on the variations in outputs of these photodiodes, variations in the intensity level of the incident light caused by a wavelength variation of the incident light and caused by a secular change in the semiconductive laser.

Although the wavelength locker modules of the kinds exemplarily shown in FIGS. 10 and 11 are compact as compared to the wavelength locker module including an optical branching coupler, they require an increased incident angle of the incident light entering the branching filter 13 or the demultiplexing filter 19. For this reason, the filter transmission characteristic, i.e., the photodiode output characteristic is different between when the incident light to the filter is a horizontally polarized wave (shown by the characteristic line P in FIG. 12) and when it is a vertically polarized wave (shown by the characteristic line S in FIG. 12). In the case of the filter whose light transmittance has a polarization dependency to produce a substantial polarization-dependent loss, an error occurs in the wavelength variation detection by the wavelength locker module.

SUMMARY OF THE INVENTION

An object of the present invention is to provide a wavelength locker module which is compact and capable of accurately detecting quantities of light beams branched from incident light, thereby improving the accuracy of detection of wavelength variation in the incident light based on the light beam quantities.

Another object of the present invention is to provide a wavelength controller which is capable of detecting and suppressing a wavelength variation in incident light based on light beam quantities detected by a wavelength locker module provided therein.

A wavelength locker module according to one aspect of the present invention comprises a prism for dividing incident light into at least first and second branched light beams; a wavelength selective filter for permitting part of the first branched light beam emitted from said prism to pass therethrough; a first light quantity detector for receiving the part of the first branched light beam having passed through said wavelength selective filter; and a second light quantity detector for directly receiving the second branched light beam emitted from said prism.

The wavelength locker module of this invention which employs the prism as an element for branching incident light makes it possible to appropriately divide the incident light into branched light beams even when the incident light enters the prism at a small angle. A small incident angle decreases an error, caused by polarization-dependent loss, in detecting a wavelength variation, permitting an accurate wavelength variation detection. In addition, the prism is compact in size as compared to an optical branching coupler, contributing to the realization of a compact wavelength locker module.

According to another aspect of the present invention, there is provided a wavelength controller which comprises a wavelength locker module of the aforementioned type; wavelength variation detecting means for detecting, based on outputs of the first and second light quantity detectors of the wavelength locker module, a wavelength variation in incident light entering the wavelength locker module; and wavelength variation suppressing means for suppressing the wavelength variation in accordance with a detection result obtained by said wavelength variation detecting means.

With this invention, since the wavelength locker module is compact, the wavelength controller can be compact in size. It is also possible to accurately detect and suppress the wavelength variation of the incident light based on the outputs of the light quantity detectors, thereby maintaining an optical signal constant, which signal is generated by an optical signal generator such as a semiconductive laser for use with the wavelength controller of this invention.

DETAILED DESCRIPTION

Figure 1:
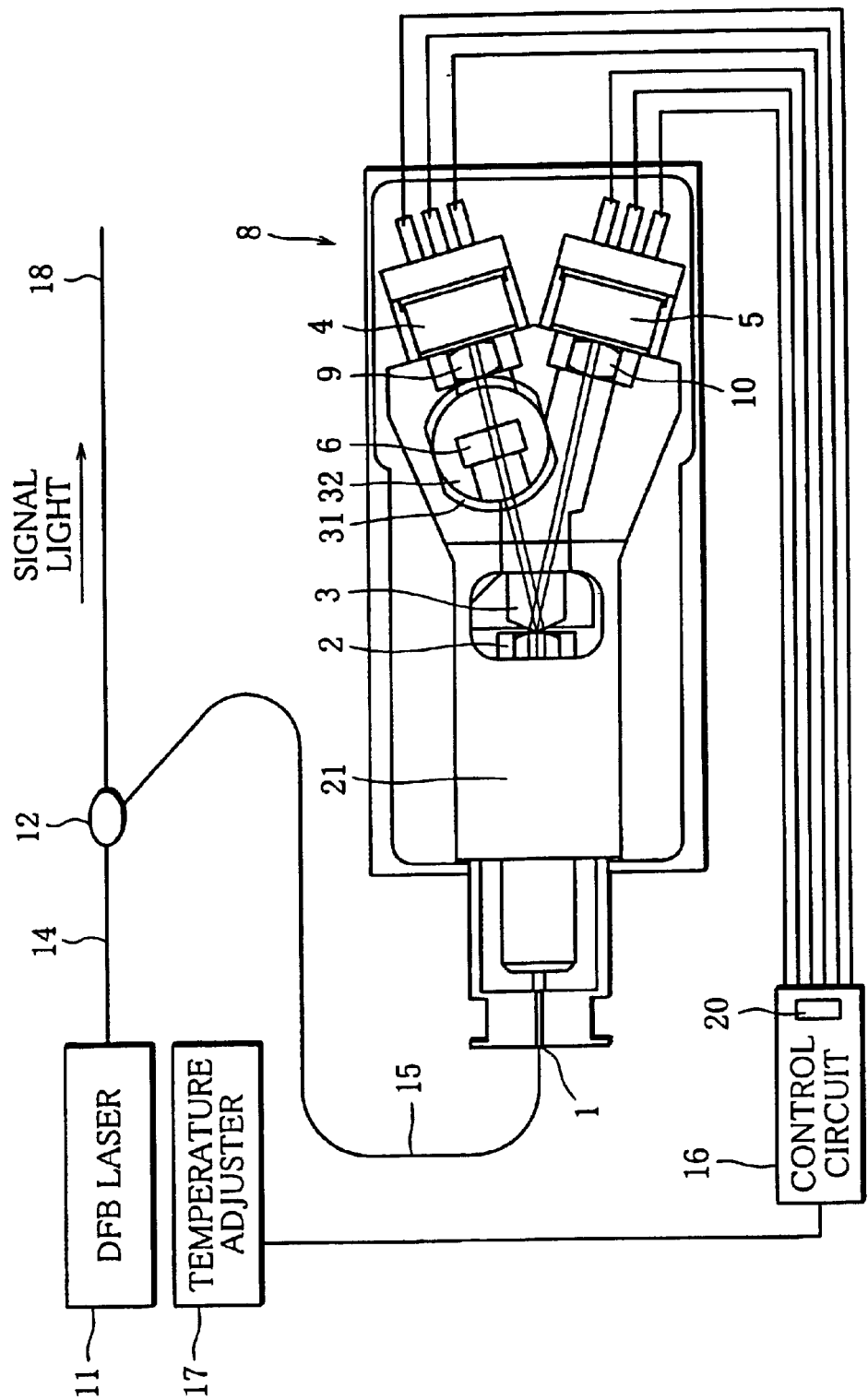
FIG. 1 is a view showing a wavelength controller according to an embodiment of the present invention.

As mentioned previously, a wavelength locker module of this invention comprises a prism for dividing incident light into branched light beams; a wavelength selective filter for permitting part of a first branched light beam to pass therethrough; a first light quantity detector for receiving the part of the first branched light beam having passed through the wavelength selective filter; and a second light quantity detector for directly receiving a second branched light beam, thereby permitting an accurate wavelength variation detection and realizing a compact wavelength locker module.

In the wavelength locker module of this invention, preferably, said wavelength selective filter has a light transmission characteristic providing more than predetermined ratio of a change in optical transmittance to a change in wavelength of the incident light in a wavelength region including an incident light wavelength.

According to this preferred embodiment, when the wavelength of the incident light to the wavelength locker module varies, a large variation occurs in a light quantity of that part of the first branched light which has passed through said wavelength selective filter, causing a large variation in a light quantity received by the first light quantity detector, improving the accuracy of wavelength variation detection by the first light quantity detector.

Preferably, the wavelength locker module comprises angle adjustment means for variably adjusting orientation of said wavelength selective filter to said prism, whereby the incident angle of said first branched light into said wavelength selective filter is adjusted to be in a range from 0 deg to 5 deg.

According to this preferred embodiment, the incident angle of the branched light beam to the wavelength selective filter can be variably adjusted. Since the optical transmission characteristic (i.e., transmittance-wavelength characteristic curve) of the wavelength selective filter varies depending on the incident angle of light to the filter, the incident angle adjustment can cause the transmittance-wavelength characteristic curve to have a large gradient at a wavelength region including the incident light wavelength, permitting a large variation to occur in light quantity received by the first light quantity detector with the change in incident light wavelength, thereby improving the accuracy of wavelength variation detection based on the output of the first light quantity detector. In addition, by setting the incident angle to be less than 5 deg, the polarization-dependent loss in the wavelength selective filter can be prevented from increasing.

Preferably, said prism has a roof-shaped incident surface thereof comprised of first and second inclination surfaces each obliquely extending relative to a normal line of the incident light entering said prism. Said prism branches the incident light into said first and second branched light beams.

With this embodiment, by appropriately selecting the angle formed between each inclination surface and the normal line of the incident light in consideration of the layout and dimensions of structural elements, including the prism etc., of the wavelength locker module, it is possible to accurately direct the first and second branched light beams toward the first and second light quantity detectors, respectively, thereby improving the detection accuracy based on the detector outputs.

More preferably, the angle formed between each of said first and second inclination surfaces and the normal line of the incident light to said prism is in a range from 10 deg to 65 deg.

According to this embodiment, the wavelength locker module can be compacted and the wavelength variation detection accuracy can be improved. Depending on the layout and/or sizes of the structural elements of the wavelength locker module, if the above-mentioned angle is less than 10 deg, the first and second branched light beams are required to travel a long distance until a sufficiently wide separation is defined between their optical paths. In this case, the installation distance between the structural elements of the module must be increased, resulting in a large-sized wavelength locker module. On the other hand, if the angle is greater than 65 deg, a substantial error tends to occur in the wavelength variation detection due to the affection of polarization-dependent loss.

As mentioned previously, a wavelength controller of this invention comprises a wavelength locker module of the aforementioned type; wavelength variation detecting means for detecting a wavelength variation in incident light entering the wavelength locker module; and wavelength variation suppressing means for suppressing the wavelength variation, thereby realizing a compact wavelength controller and maintaining an optical signal generated by an optical signal generator constant.

In the wavelength controller of this invention, preferably, said wavelength variation detecting means calculates an output ratio based on the outputs of said first and second light quantity detectors, and detects the wavelength variation in the incident light based on the output ratio and a wavelength variation detection curve representing a relationship between the incident light wavelength and the output ratio.

The just-mentioned preferred embodiment makes it possible to accurately detect the wavelength variation in the incident light based on the outputs of the light quantity detectors.

Preferably, said wavelength variation suppressing means includes temperature adjusting means for variably adjusting a temperature of an optical signal generator for use with the wavelength controller.

The wavelength controller according to the just-mentioned preferred embodiment maintains the wavelength of an optical signal constant, which signal is generated by the optical signal generator such as a distributed feed-back type semiconductive laser having characteristics such that the wavelength of the optical signal varies depending on the temperature of the optical signal generator.

In the following, a wavelength controller according to an embodiment of the present invention will be explained.

The wavelength controller of the present embodiment is arranged to detect a wavelength variation in an optical signal generated by a distributed feed-back semiconductive laser (hereinafter referred to as DFB laser) for use as a light source for wavelength division multiplexing communication, and to suppress the wavelength variation to thereby make the wavelength of the optical signal constant.

As shown in FIG. 1, an optical fiber 14 extending from the DFB laser 11 is connected with the input side of an optical coupler 12 having the output side thereof connected with optical fibers 15 and 18. Part of light emitted from the DFB laser 11 is transmitted as optical signal in the optical fiber 18 to be used for a desired application, whereas the remaining light, serving as measurement light, is caused to enter the wavelength controller through the optical fiber 15.

The wavelength controller comprises a wavelength locker module 8 for dividing the measurement light into first and second branched light beams and for detecting quantities of the branched light beams; a control circuit 16 for detecting a wavelength variation in the measurement light while eliminating affection of the intensity level change in the measurement light caused by a secular change in the DFB laser 11; and a temperature adjuster 17 for adjusting the temperature of the DFB laser 11 under the control of the control circuit 16.

More specifically, the wavelength locker module 8 has an incident section 1 to which the optical fiber 15 is connected. Thus, single-wavelength measurement light, emitted from the DFB laser 11 and entering the optical fiber 15 through the optical fiber 14 and the optical coupler 12, is transmitted through the optical fiber 15 and enters the incident section 1. In the wavelength locker module 8, an optical transmission path such as an optical waveguide, not shown, is provided between the incident section 1 and a lens 2, and a prism 3 is disposed near an emitting face of the lens 2.

Figure 2A:
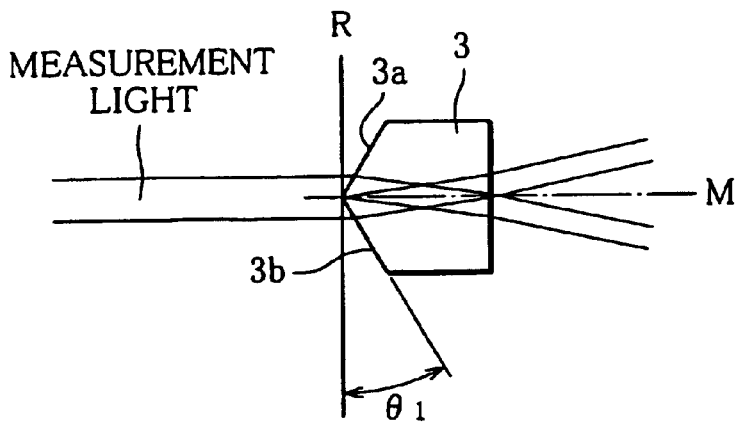
FIG. 2A is a view for explaining an incident-light branching function of the prism shown in FIG. 1.
Figure 2B:
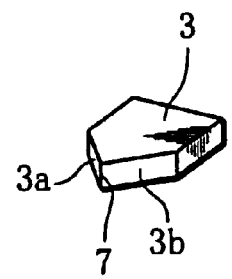
FIG. 2B is a perspective view of the prism.

As shown in FIGS. 2A and 2B, the prism 3 is formed into a shape which is symmetric with respect to a vertical plane passing through its longitudinal axis M, and has the incident surface formed into a roof-shape consisting of first and second inclination surfaces 3a and 3b. Each inclination surface 3a or 3b obliquely extends at an angle θ1 relative to the normal line (shown by symbol R in FIG. 2A) of the measurement light. In FIG. 2B, reference numeral 7 denotes a ridge line at which the inclination surfaces 3a and 3b cross each other. The incident surface 3a, 3b is covered with a layer having no polarization characteristics, such as an anti-reflection coat.

In the above arrangement, the measurement light entering the incident section 1 of the wavelength locker module 8 is introduced via the optical transmission path into the lens 2 where it is converted into parallel light. Then, the measurement light enters the vicinity of the ridge line 7 of the prism 3 and is branched by the prism 3 into first and second branched light beams.

Provided on the emission side of the prism 3 are a wavelength selective filter 6 which the first branched light beam enters, a first photodiode 4, serving as a first light quantity detecting means, for receiving the first branched light beam through the wavelength selective filter 6, and a second photodiode 5, serving as a second light quantity detecting means, for directly receiving the second branched light beam. The first and second photodiodes 4 and 5 are provided at their light receiving side with condensing lenses 9 and 10, respectively. An optical transmission path is disposed between the prism 3 and the wavelength selective filter 6 and between the prism 3 and the second photodiode 5. In the present embodiment, the wavelength selective filter 6 is comprised of a wavelength selective transmission filter for permitting incident light (here, the first branched light beam) to pass therethrough at transmittance varying depending on incident light wavelength that falls within a prescribed wavelength region.

In this arrangement, part of the first branched light beam passes through the wavelength selective filter 6, and the light quantity of the transmitting light is detected by the first photodiode 4, whereas the light quantity of the second branched light beam is detected by the second photodiode 5. The outputs of the photodiodes 4 and 5 are supplied to wavelength variation detecting means 20 in a control circuit 16. As described later, the wavelength variation in the measurement light is detected by the detecting means 20.

To improve the accuracy of wavelength variation detection, the wavelength locker module 8 of the present embodiment has the following features.

First, the measurement light is caused to enter the vicinity of ridge line 7 of the incident surface of the prism 3. In this case, the measurement light can be divided by the prism 3 into the first and second branched light beam having substantially the same intensity. This simplifies the wavelength variation detecting process performed based on the photodiode outputs. In addition, the polarization-dependent loss can be reduced by causing the measurement light to enter the vicinity of the ridge line 7.

Figure 3A:
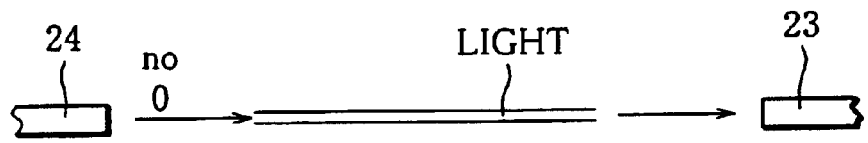
FIG. 3A is a view showing a system for measuring a polarization-dependent loss, with the incident light directly entering a photodiode.

The present inventors made experimental measurements in respect of polarization-dependent loss. In this measurements, light emitted from an optical fiber 24 was introduced into a photodiode (not shown) via an optical fiber 23, as shown in FIG. 3A, and a wavelength at which the quantity of detected light becomes half (−3 dB) the maximum light quantity was found out while varying the wavelength within a predetermined wavelength region, and then the polarization-dependent loss at that wavelength was measured. Also, light emitted from the optical fiber 24 was introduced into a photodiode via a prism and an optical fiber 23, and the polarization-dependent loss at a wavelength giving the light quantity which was half the maximum quantity was measured. At this time, the incident position of the light into the prism was varied at intervals of 0.2 mm, so that the polarization-dependent loss was measured in respect of 14 incident positions. The measurement results are shown in Table 1. In Table 1, the measurement result obtained by the method shown in FIG. 3A is represented by measurement number 0, whereas the results obtained at the 14 incident positions by the method shown in FIG. 3B are represented by numbers 1–14.

Figure 3B:
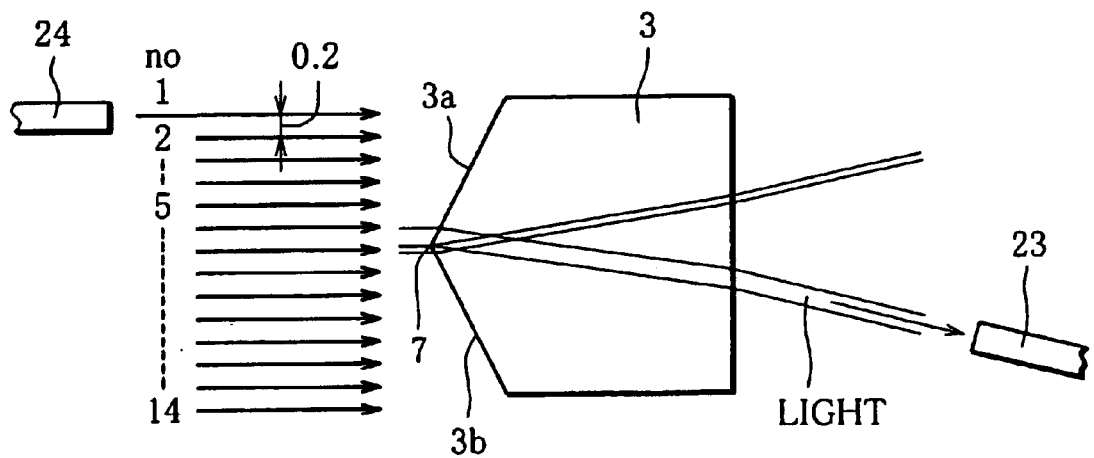
FIG. 3B is a view showing the polarization-dependent loss measuring system, with the incident light entering the photodiode through a prism.

As apparent from the measurement result shown in Table 1, when light is entered at any one of incident positions 1–5 in the method of FIG. 3B using the prism, the polarization-dependent loss is about −0.02 dB which is substantially the same level as that obtained in the method of FIG. 3A using no prism. This indicates that a degraded accuracy in wavelength variation detection due to the polarization-dependent loss can be suppressed, if the measurement light is entered into an incident positional region, corresponding to the incident positions 1–5 shown in FIG. 3B, of the incident surface of the wavelength locker module 8 shown in FIG. 1.

TABLE 1

| Measurement number | Polarization-dependent loss (dB) |
| --- | --- |
| 0 | −0.0163 |
| 1 | −0.0156 |
| 2 | −0.0183 |
| 3 | −0.0204 |
| 4 | −0.0189 |
| 5 | −0.0198 |
| 6 | −0.0327 |
| 7 | −0.0280 |
| 8 | −0.0317 |
| 9 | −0.0371 |
| 10 | −0.0442 |
| 11 | −0.0500 |
| 12 | −0.0552 |
| 13 | −0.0975 |
| 14 | −0.1982 |

By taking the above-mentioned measurement results into consideration, the wavelength locker module 8 of this embodiment is designed to cause the measurement light to enter the vicinity (corresponding to the incident position 5 shown in FIG. 3B) of the ridge line 7 of the incident surface of the prism 3, as mentioned above. In order to reduce the polarization-dependent loss, it is desired to decrease the angle θ1 (incident angle of the measurement light to the prism 3) formed between the incident surface 3a, 3b and the normal line R of the measurement light (incident light). In the wavelength locker module 8 of this embodiment, it has been proved that the detection error due to the polarization-dependent loss increases when the incident angle θ1 exceeds about 65 deg. Depending on the layout and dimensions of the structural elements of the wavelength locker module 8, when the incident angle θ1 is less than about 10 deg, the wavelength locker module 8 is large in size because the first and second branched light beams must be transmitted over a long distance to sufficiently widen the spacing between their optical paths. Thus, in the present embodiment, the angle θ1 is set to a value within a range from about 10 deg to about 60 deg, e.g., 25 deg.

In addition, with the intention of improving the wavelength variation detecting accuracy, the wavelength locker module 8 of this embodiment comprises angle adjustment means for variably adjusting the orientation of the wavelength selective filter 6 relative to the prism 3. The angle adjustment means of this embodiment is constituted by a base 31 and a rotary table 32 which is rotatable relative to the base and on which the wavelength selective filter 6 is disposed.

Although a detailed illustration will be omitted, the angle adjustment means 31, 32 is provided with a gear shaft rotatably supported by the base 31 and extending through the base in the horizontal direction. The gear shaft has an outer end face thereof formed with a groove into which a tip of a screwdriver can be inserted, and a bevel gear is fixed to an inner end portion of the gear shaft and in mesh with another bevel gear fixed to a bottom face of the rotary table 32. Thus, by manually rotating the screwdriver with its tip end inserted into the groove formed in the gear shaft, the wavelength selective filter 6 is rotated relative to the base 31 in unison with the rotatable table 32. In this embodiment, the filter face angle η (see, FIG. 4) of the wavelength selective filter 6 is adjusted by the angle adjustment means 31, 32 in units of 0.1 deg, for instance, so that the incident angle of the first branched light beam to the wavelength selective filter 6 may be in a range from 0 deg to 5 deg.

As explained in the above, the incident angle of light to the wavelength selective filter 6 is varied in the angle adjustment. This causes a change in the light transmission characteristic (relation between incident light wavelength and transmittance) and hence in the detection accuracy based on the output of the first photodiode 4.

Figure 4:
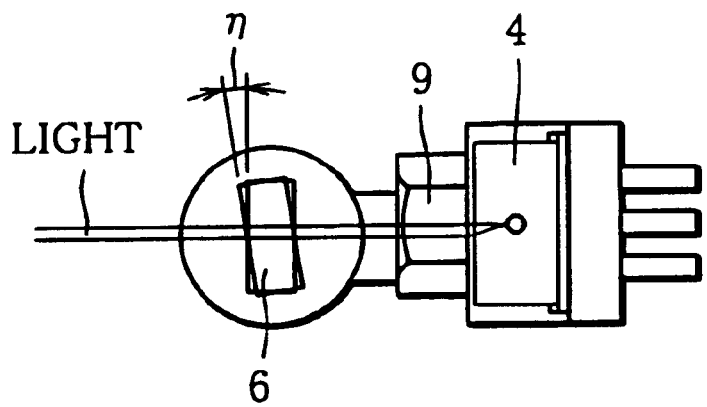
FIG. 4 is a view for explaining the function of angle adjustment means provided in the wavelength locker module shown in FIG. 1.
Figure 5:
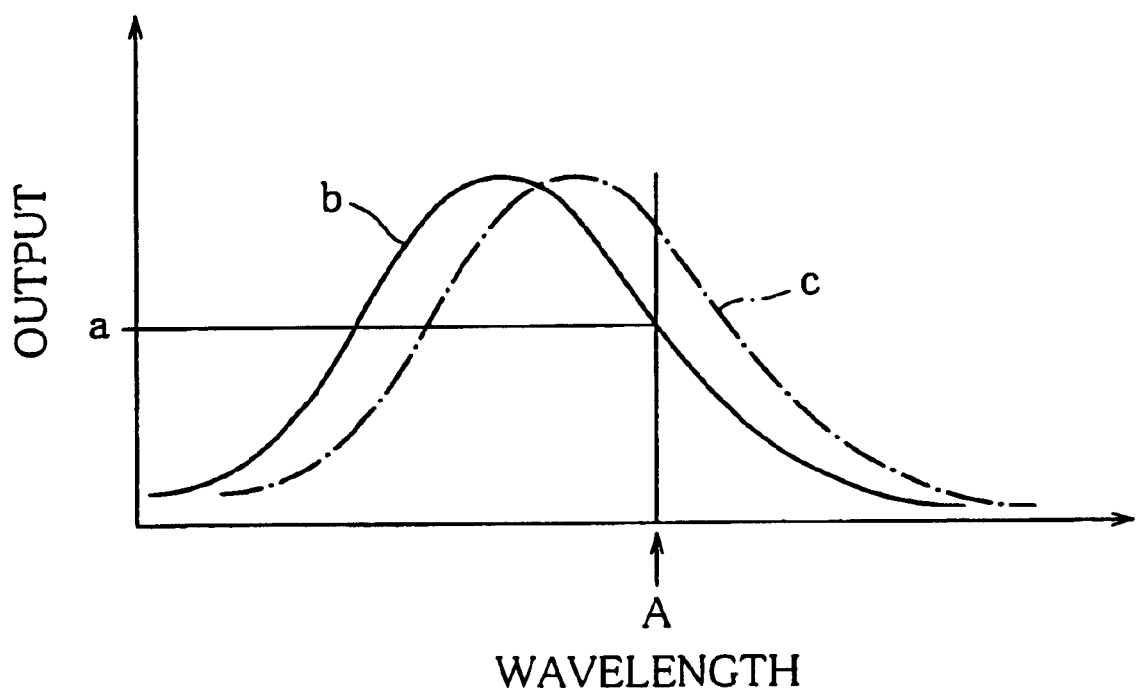
FIG. 5 is a graph showing the relationship between angle adjustment by the angle adjustment means and photodiode output.

Specifically, when the filter face angle η of the wavelength selective filter 6 is changed from 0 deg to η2 in FIG. 4, the light transmission characteristic of the wavelength selective filter 6 or the output of the first photodiode 4 changes from the characteristic curve c to the curve b shown in FIG. 5. As compared to the characteristic curve c, the gradient of the characteristic curve b is sharp in the vicinity of the rated wavelength of the output light of the DFB laser 11. For this reason, when the wavelength varies in the vicinity of the rated wavelength A, the light quantity received by the first photodiode 4 greatly varies to cause a grater change in the photodiode output. In other words, the detection accuracy based on the first photodiode output is improved when the angle η is at η2 as compared to the case where it is set at 0 deg. However, if the angle η exceeds 5 deg, an undesired large polarization-dependent loss occurs in the wavelength selective filter 6.

As explained in the above, the wavelength controller of this embodiment is so designed that the wavelength variation in the measurement light is detected by the wavelength variation detecting means 20 based on the outputs of the first and second photodiodes 4 and 5. In the following, an example of the wavelength variation detecting process will be explained.

In the wavelength controller shown in FIG. 1, when the intensity of the output laser light beam of the DFB laser 11 (i.e., the intensity of the measurement light entering the wavelength locker module 8) varies in the increasing direction, the wavelength-output characteristic of the first photodiode 4 varies from the characteristic curve b to the curve b', whereas that of the second photodiode 5 varies from the characteristic curve e to the curve e'. Thus, with the increase in the intensity of the measurement light having the rated wavelength A, the outputs of the first and second photodiodes 4, 5 vary from the value a to the value a' and from the value f to the value f' in the increasing direction, respectively.

In this manner, there occur variations in the wavelength-output characteristics of the first and second photodiodes 4 and 5 with the intensity level change in the output light of the DFB laser 11. This indicates the possibility of occurrences of wavelength variation detection error due to the level change in the output laser light beam, which is in turn caused by a secular change of the DFB laser 11.

Figure 6:
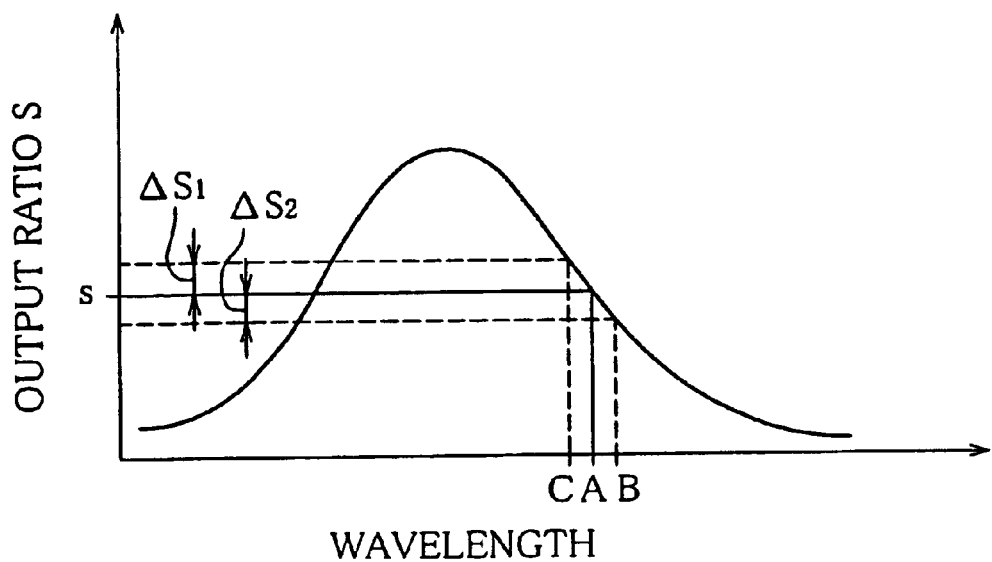
FIG. 6 is a view showing a wavelength variation detecting curve employed for wavelength variation detection by the wavelength variation detecting means provided in the control circuit shown in FIG. 1.
Figure 7:
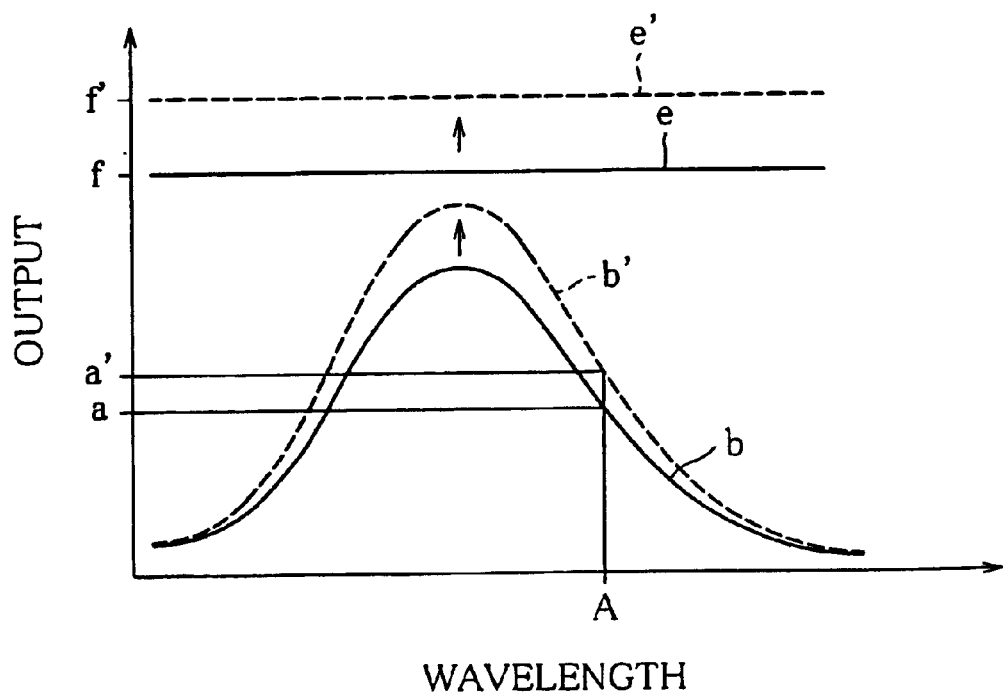
FIG. 7 is a graph showing changes in outputs of first and second photodiodes shown in FIG. 1 with a change in DFB laser output.

In order to detect the wavelength variation in the measurement light while compensating for the intensity level change in the output light of the DFB laser 11, the wavelength variation detecting means 20 of this embodiment divides the output of the first photodiode 4 by the output of the second photodiode 5 to calculate the photodiode output ratio S, calculates the difference ΔS between the calculated output ratio S and the ordinary output ratio s, and detects the wavelength variation based on the output ratio difference ΔS referring to the wavelength variation detecting curve shown in FIG. 6. The ordinary output ratio s indicates the photodiode output ratio that is obtained when the output light of the DFB laser 11 is at the ordinary intensity level. The wavelength variation detecting curve represents the relationship between incident light wavelength and photodiode output ratio and corresponds to the wavelength-output characteristic curve of the first photodiode 4 observed when the output light of the DFB laser 11 is at the ordinary intensity level.

In the wavelength variation detection based on the wavelength variation detecting curve shown in FIG. 6, when the photodiode output ratio S is greater by, e.g., ΔS1 than the ordinary value s, it is determined that the output wavelength of the DFB laser 11 shifts toward the short-wavelength side from the rated wavelength A to the wavelength C, whereas it is determined that the output wavelength shifts toward the long-wavelength side from the rated wavelength A to the wavelength B when the photodiode output ratio S is, e.g., ΔS2 lower than the ordinary value s. With this wavelength variation detection, an accurate wavelength variation detection can be made with ease.

As distinct from the present embodiment where the measurement light entering the vicinity of the ridge line 7 is divided into the first and second branched light beams in the intensity ratio 1:1, if the intensity ratio is not equal to 1:1, a wavelength variation detecting curve (not shown) prepared beforehand so as to be adapted for the intensity ratio between the first and second branched light beams is utilized instead of the curve shown in FIG. 6.

Figure 10:
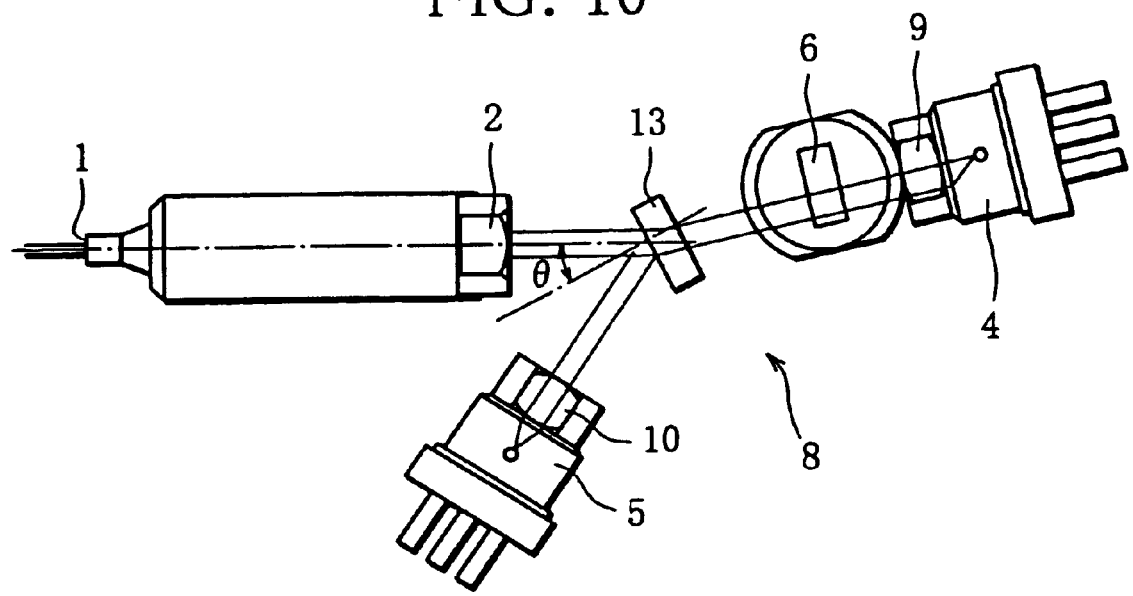
FIG. 10 is a view exemplarily showing a conventional wavelength locker module.
Figure 11:
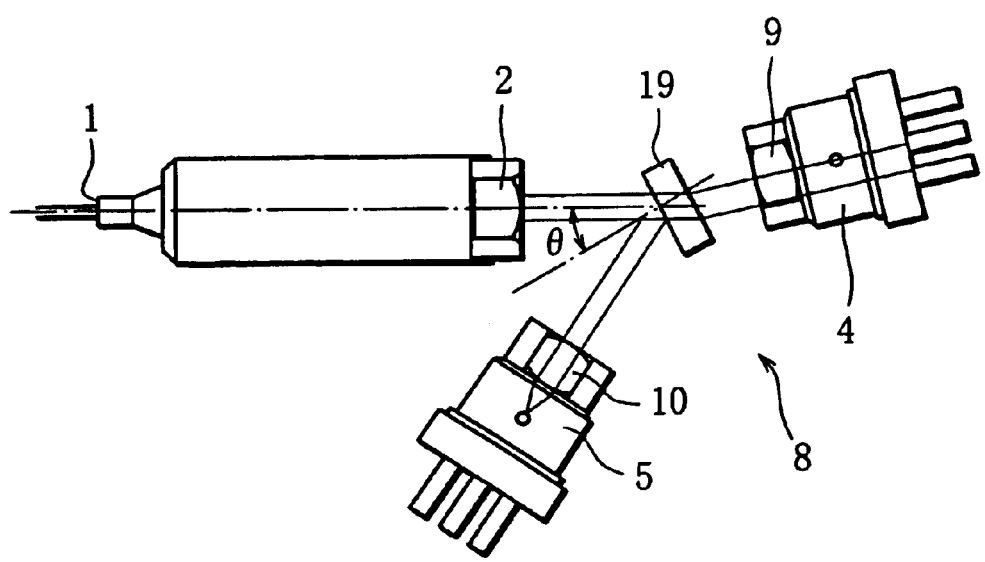
FIG. 11 is a view showing another conventional wavelength locker module.
Figure 12:
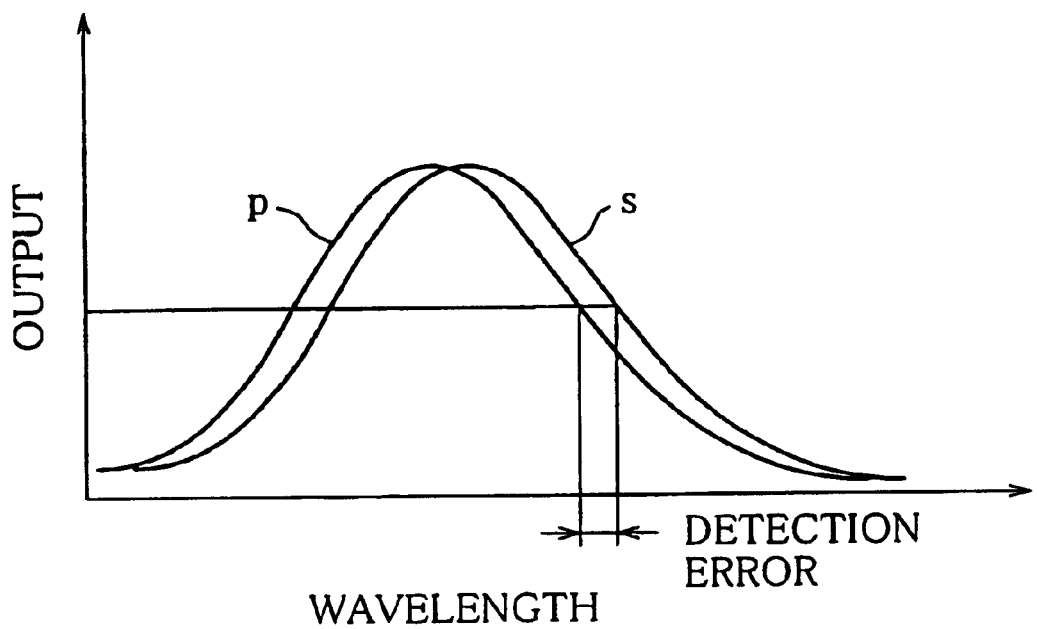
FIG. 12 is a graph for explaining a wavelength variation detection error, caused by polarization-dependent loss, in the conventional wavelength locker modules shown in FIGS. 10 and 11.
Figure 13:
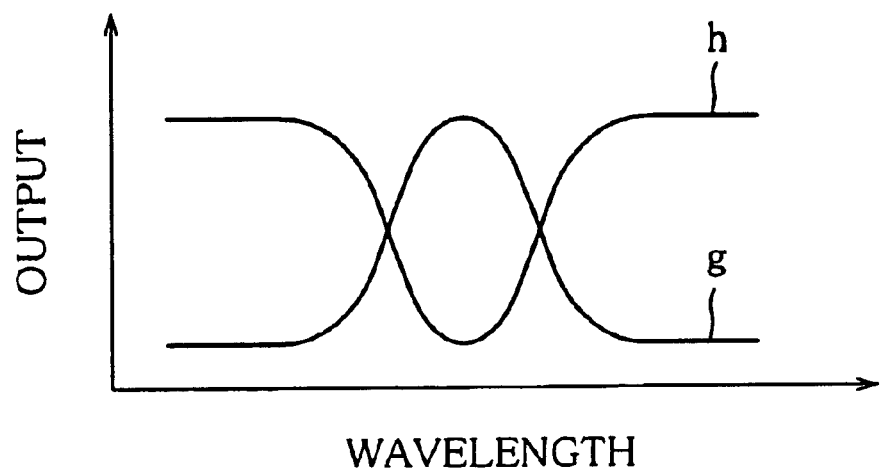
FIG. 13 is a graph showing the relationship between incident light wavelength and photodiode outputs in the conventional wavelength locker module shown in FIG. 11.

Alternatively, as in the case of the prior art shown in FIG. 10, the wavelength variation may be detected using the outputs of the first and second diodes 4 and 5 while eliminating the affection of light intensity variation caused by a secular change of the DFB laser 11.

As explained in the above, the wavelength controller according to the present embodiment is designed to make the wavelength of the output light of the DFB laser 11 constant, by adjusting the temperature of the DFB laser 1 with use of the temperature adjuster 17 that is operated under the control of the control circuit 16.

More specifically, the control circuit 16 generates a temperature control signal for increasing the temperature of the DFB laser 11 when the wavelength variation detecting means 20 detects a shift of the output wavelength of the DFB laser 11 toward the short-wavelength side, whereas it generates a temperature control signal for decreasing the laser temperature when a shift toward the long-wavelength side is detected. The temperature adjuster 17 that is provided with, e.g., a Peltier element is capable of adjusting the temperature of the DFB laser 11 in accordance with the temperature control signal supplied from the control circuit 16. Thus, the laser temperature is increased or decreased such as to cancel out the wavelength variation in the laser light by means of the temperature adjuster 17, whereby the output light wavelength is maintained at the rated wavelength.

In operation of the wavelength controller of this embodiment, the output light from the DFB laser 11 is introduced, as the measurement light, into the incident section 1 of the wavelength locker module 8 via the optical fiber 14, optical coupler 12 and optical fiber 15. The measurement light is then introduced via the lens 2 into the vicinity of the ridge line 7 of the roof-shaped incident surface 3a, 3b of the prism 3, to be divided into the first and second branched light beams in the intensity ratio 1:1. With the simple construction constituted by the roof-shaped prism 3, the measurement light is efficiently divided into two. As distinct from the branching filter 13 provided in the conventional wavelength locker module shown in FIG. 10, the prism 3 does not produce an affection on the first and second branched light beams, attributable to polarization-dependent loss.

Next, part of the first branched light beam passes through the wavelength selective filter 6 and enters the first photodiode 4, whereas the second branched light beam enters the second photodiode 5.

The wavelength selective filter 6 has the wavelength-transmittance characteristic such that the transmittance at the rated wavelength A is about half (3 dB lower than) the maximum transmittance, so that the transmittance greatly varies when the measurement light entering the filter 6 varies in the vicinity of the rated wavelength A. This contributes to the improvement of the wavelength variation detecting accuracy. In other words, the wavelength selective filter 6 is sensitive to wavelength variation. Further, the filter face angle η of the wavelength selective filter 6 can be set at a preferable angle in a range from 0 deg to 5 deg with use of the angle adjusting means 31, 32, thus further improving the accuracy of wavelength variation detection.

Based on the outputs of the first and second photodiodes 4 and 5, the wavelength variation detecting means 20 of the control circuit 16 detects the wavelength variation, and the control circuit 16 supplies the temperature adjuster 17 with the temperature control signal varying depending on the wavelength variation. The temperature adjuster 17 increases or decreases the temperature of the DFB laser 11 so as to cancel out the wavelength variation, whereby the wavelength of the output light from the DFB laser 11 is maintained at the rated wavelength.

The present invention is not limited to the above-mentioned embodiment, but can be modified in various manners.

Figure 8A:
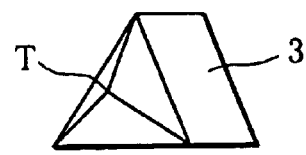
FIG. 8A is a perspective view showing a modification of the prism for the wavelength locker module.
Figure 8B:
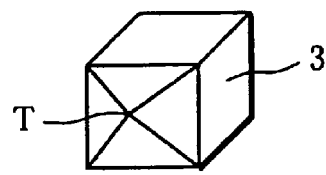
FIG. 8B is a perspective view of another modification of the prism.
Figure 8C:
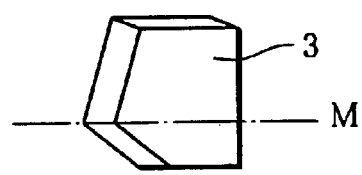
FIG. 8C is a perspective view showing a further modification of the prism.

For instance, although the foregoing embodiment uses the roof-shaped prism 3, a prism shown in FIG. 8A, 8B or 8C may be used instead. The prism 3 shown in FIG. 8A is comprised of a pillar of triangular cross-section whose incident side is formed into a trigonal pyramid shape, to thereby divide incident light, entering the vicinity of the apex T of the trigonal pyramid, into three. The prism 3 shown in FIG. 8B is comprised of a square pillar having a quadrangular-pyramid shaped incident side, and divides incident light entering the vicinity of the apex T of the quadrangular pyramid into four. The prism 3 shown in FIG. 8C is formed into a roof shape which is asymmetric with respect to its longitudinal axis.

Figure 8D:
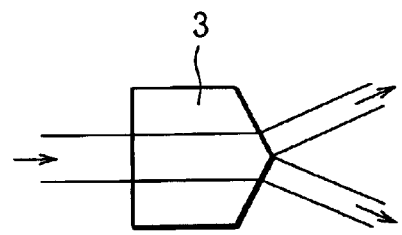
FIG. 8D is a view showing the incident-light branching function of the prism achieved when an emitting surface of the prism shown in FIG. 1 is utilized as an incident surface.
Figure 9:
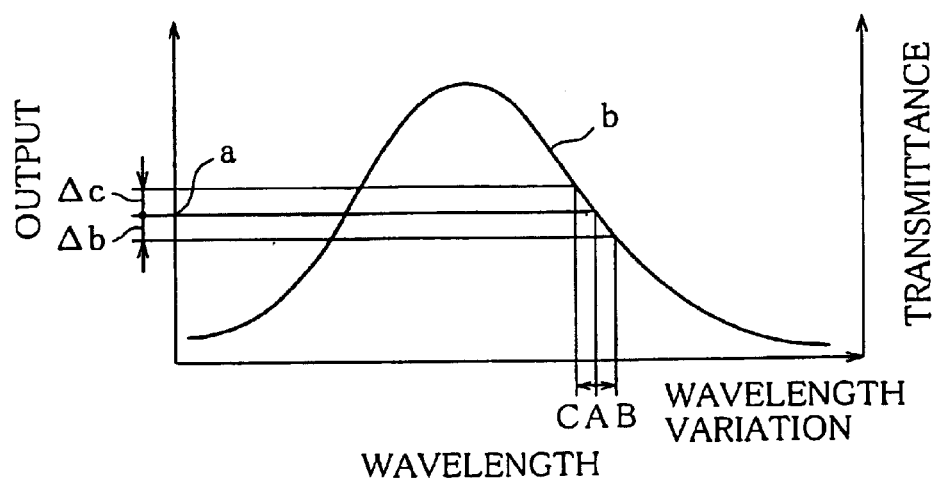
FIG. 9 is a graph showing the relationship between incident light wavelength and output of a photodiode receiving the incident light through a wavelength selective filter.

Although the foregoing embodiment is configured to cause incident light to enter the roof-shaped incident plane 3a, 3b of the prism 3, incident light may be entered into a flat incident plane and divided into two at a roof-shaped radiation plane of the prism, as shown in FIG. 8D.

In stead of using the wavelength selective filter 6 having the wavelength-transmittance characteristic to provide half the maximum transmittance in the vicinity of the rated wavelength A, a wavelength selective filter may be used, which provides more than predetermined ratio of transmittance variation to wavelength variation in the vicinity of incident light wavelength.

Although the angle adjusting means 31, 32 for adjusting the orientation of the wavelength selective filter 6 is used in the foregoing embodiment, the provision of the angle adjusting means is not essentially required and the wavelength selective filter 6 may be fixed at the desired orientation.

In the embodiment, the wavelength variation detecting means 20 is provided separately from the wavelength locker module. However, the wavelength variation detecting means may be accommodated in the wavelength locker module. In this case, the wavelength locker module comprises the wavelength variation detecting function in addition to the light quantity detecting function.

Although the application to the detection and suppression of wavelength variation in respect of the DFB laser 11 has been explained in the embodiment, the wavelength locker module and wavelength controller according to the present invention may be applied to the wavelength variation detection and suppression for optical amplifier utilizing light having a wavelength of 980 nm or 1480 nm, for instance.

What is claimed is:

1. A wavelength locker module comprising:

a prism for configured to divide incident light into at least first and second branched light beams;

a wavelength selective filter configured to permit part of the first branched light beam emitted from said prism to pass therethrough;

a first light quantity detector configured to receive the part of the first branched light beam having passed through said wavelength selective filter; and a second light quantity detector configured to receive the second branched light beam emitted from said prism, wherein said wavelength selective filter has a light transmission characteristic providing more than predetermined ratio of a change in optical transmittance to a change in wavelength of the incident light in a wavelength region including an incident light wavelength.

2. The wavelength locker module according to claim 1, further comprises an angle adjuster configured to variably adjust an orientation of said wavelength selective filter with respect to said prism, so that an incident angle of the first branched light into said wavelength selective filter is adjusted to be in a range from 0 deg to 5 deg.

3. The wavelength locker module according to claim 1, wherein said prism has a roof-shape incident surface thereof comprised of first and second inclination surface each obliquely extending relative to a normal line of the incident light entering said prism, and said prism branches the incident light into said first and second branched light beams.

4. The wavelength locker module according to claim 3, wherein an angle formed between each of said first and second inclination surfaces and the normal line of said first and second incident light to said prism is in a range from 10 deg to 65 deg.

5. A wavelength controller comprising:

a wavelength locker module having a prism configured to divide incident light into at least first and second branched light beams;

a wavelength selective filter configured to permit part of the first branched light beam emitted from said prism to pass therethrough;

a first light quantity detector configured to receive the part of the first branched light beam having passed through said wavelength selective filter;

and a second light quantity detector configured to receive the second branched light beam emitted from said prism;

a wavelength variation detector which is configured to detect, based on outputs of first and second light quantity detectors of the wavelength locker module, a wavelength variation in incident light entering the wavelength locker module; and a wavelength variation suppressing mechanism which is configured to suppress the wavelength variation in accordance with a detection result obtained by said wavelength variation detector.

6. The wavelength controller according to claim 5, wherein said wavelength variation detector is configured to calculate an output ratio based on the outputs of said first and second light quantity detectors, and detects the wavelength variation in the incident light based on the output ratio and a wavelength variation detection curve representing a relationship between the incident light wavelength and the output ratio.

7. The wavelength controller according to claim 5, wherein said wavelength variation suppressing mechanism includes a temperature adjustor configured to adjust a temperature of an optical signal generator for use with the wavelength controller.

8. The wavelength controller according to claim 5, wherein said wavelength locker module has a wavelength selective filter having a light transmission characteristic providing more than a predetermined ratio of a change in optical transmittance to a change in wavelength of the incident light in a wavelength region including an incident light wavelength.

9. The wavelength controller according to claim 5, further comprising an angle adjuster configured to variably adjust orientation of said wavelength selective filter with respect to said prism, such that an incident angle of the first branched light into said wavelength selective filter is adjusted to be in a range from 0 deg to 5 deg.

10. The wavelength controller according to claim 5, wherein the prism in said wavelength locker module has a roof-shaped incident surface thereof comprised of first and second inclination surface each obliquely extending relative to a normal line of the incident light entering said prism, and said prism branches the incident light into said first and second branched light beams.

11. The wavelength controller according to claim 10, wherein an angle formed between each of said first and second inclination surfaces and the normal line of said first and second incident light to said prism is in a range from 10 deg to 65 deg.

* * * * *